United States Patent

Kapetanic et al.

[19]

[11] Patent Number: 6,163,223
[45] Date of Patent: Dec. 19, 2000

[54] HIGH PERFORMANCE DUAL MODE MULTIPLE SOURCE/LOCAL OSCILLATOR MODULE

[75] Inventors: Peter Kapetanic, Morgan Hill; Oggi Park Lin, San Jose, both of Calif.

[73] Assignee: Anritsu Company, Morgan Hill, Calif.

[21] Appl. No.: 09/389,311

[22] Filed: Sep. 2, 1999

Related U.S. Application Data

[60] Provisional application No. 60/098,806, Sep. 2, 1998.

[51] Int. Cl.[7] .................................. H03L 7/07; H03L 7/22
[52] U.S. Cl. .................................. 331/2; 331/14; 331/18; 331/25; 331/56; 331/74; 331/77
[58] Field of Search .................................. 331/14, 2, 18, 331/25, 56, 74, 76, 77

[56] References Cited

U.S. PATENT DOCUMENTS 5,270,669  12/1993  Jokura ........................................ 331/2
5,572,167  11/1996  Alder et al. .................................. 331/2
5,610,558  3/1997  M ittel et al. .............................. 331/2

*Primary Examiner*—Siegfried H. Grimm
*Attorney, Agent, or Firm*—Fliesler, Dubb, Meyer & Lovejoy

[57] ABSTRACT

A dual-mode multiple signal source/local oscillator module is capable of operating in either an independent offset mode or a common offset mode. The module includes first and second coarse frequency sources, a first signal generator coupled to the first coarse frequency source, a second signal generator, and an offset switch coupled to the second signal generator. The offset switch connects the second signal generator to either the first coarse frequency source in the common offset mode, or the second coarse frequency source in the independent offset mode. Operation of the sources in the common offset mode provides the benefits of dynamic tracking which include reduction of receiver IF phase noise and spurious signal content, improved receiver IF settling speed, and higher measurement accuracy.

79 Claims, 2 Drawing Sheets

HIGH PERFORMANCE DUAL MODE MULTIPLE SOURCE/LOCAL OSCILLATOR MODULE

CROSS-REFERENCE TO PROVISIONAL APPLICATION

This Patent Application claims the benefit of Provisional Application Ser. No. 60/098,806, filed Sep. 2, 1998.

BACKGROUND OF THE INVENTION

1. Field of the Invention

The present invention relates to a multiple source system for use in a measurement system, such as a vector network analyzer (VNA). The source system may consist of one or more stimulus signals and a signal to be used as the VNA receiver's LO. More particularly, the present invention relates to faster relative settling of the sources and cancellation of correlated, or common mode, noise resulting in improved measurement speed and accuracy for the measurement system.

2. Background

Vector network analyzers (VNAs) have been developed by the electronics industry to measure the parameters and characteristics of electronic devices and systems at various frequency ranges including microwave and millimeter wave frequencies. A typical VNA can be used to measure the parameters of various single-port or multi-port microwave devices. The parameters measured by a conventional VNA typically include scattering parameters, insertion loss, and group delay. At least some of these parameters, such as the scattering parameters, can be measured as vector quantities, each of which has a real component and an imaginary component, or alternatively, a magnitude component and a phase component.

Conventional VNAs have been used for measuring the parameters of signals of multi-port devices. In these applications, one or more stimulus signal outputs and a VNA receiver local oscillator (LO) signal are required to measure the response of the device under test (DUT). However, conventional VNAs used with conventional multiple signal sources are not designed with dynamic tracking and do not provide for fast settling of frequencies and phases of intermediate-frequency (IF) signals generated by the receiver.

Furthermore, typical test systems using multiple-signal sources and a conventional VNA without dynamic tracking may contain significant phase noise on the VNA receiver IF signals used to measure the scattering parameters associated with the DUT. The presence of significant IF phase noise results in uncertainties in the measurements. Furthermore, a conventional VNA containing sources and an LO without dynamic tracking will not result in common mode or correlated spurious signals that ratio, or "cancel out" on the IF signals. Furthermore, since use of multiple signal sources without dynamic tracking does not allow the signals to be correlated with each other, their individual settling times, i.e., the duration for the signals to settle to a stable frequency, may vary significantly. Consequently, the relative settling time, i.e., the duration for the difference between the sources to settle to a stable IF frequency, may be long. The long relative settling time results in slower measurement speed.

Therefore, there is a need for a multiple signal source/LO module with dynamic tracking which achieves a fast settling time, eliminates or reduces spurious signals on the IF signals within the source PLL bandwidth, and reduces the IF phase noise within the source PLL bandwidth in order to improve the speed and accuracy of measurements.

SUMMARY OF THE INVENTION

The present invention accordingly provides a dual-mode multiple signal source/local oscillator module for generating at least two output signals in either an independent offset mode or a common offset mode. Operation of the sources in the common offset mode provides the benefit of dynamic tracking. Current technology limitations prevent the sources from being able to operate in common offset mode under all possible measurement scenarios. This situation typically occurs when the measurement requires that there be a large difference in frequency between the stimulus sources and the LO. In this case the source reverts to operating in the independent offset mode. The dual-mode multiple signal source module includes:

a first coarse frequency source;
 a second coarse frequency source;
 a first signal generator phase locked tracked to the first coarse frequency source;
 a second signal generator; and
 an offset switch connected to the second signal generator, capable of phase lock tracking the second signal generator to either the first coarse frequency source in the common offset mode, or the second coarse frequency source in the independent offset mode.

The first and second signal generators have a substantially identical circuit structure, each including a fine frequency source and PLL circuitry that includes a voltage controlled oscillator (VCO). The fine frequency sources are direct digital synthesizers (DDS) with a frequency resolution of 1 Hz or less which provides for finer resolution than the coarse frequency sources. The VCOs are phase locked to the selected offset oscillators and track them with a frequency difference defined by the fine frequency source DDS synthesizers.

The first and second signal generators also include first and second mixers to provide feedback signals to the respective PLLs for frequency or phase comparison with the signals generated by the fine frequency sources. Each mixer has an input coupled to the output of the VCO within the respective signal generator, another input coupled to one of the coarse frequency sources, and an output which provides the feedback signal to the respective PLL for phase comparison with the signal generated by the respective fine frequency source.

The first mixer within the first signal generator is coupled to the first coarse frequency source regardless of whether the multiple signal source/LO module is in the common offset mode or in the independent offset mode. When the multiple signal source/LO module is in the independent offset mode, the second mixer within the second signal generator is coupled to the second coarse frequency source through the offset switch. When the multiple signal source/LO module is in the common offset mode, the offset switch connects the second mixer within the second signal generator to the first coarse frequency source, to allow the first and second signal generators to share a common coarse frequency source. Each of the signal generators has its independent fine frequency source to provide an input signal with a fine frequency resolution for phase comparison by the respective PLL, regardless of whether the multiple signal source/LO module is in the common offset mode or in the independent offset mode.

In an additional embodiment, the dual-mode multiple signal source/LO module according to the present invention further comprises a third coarse frequency source and a third signal generator which has a circuit structure substantially identical to those of the first and second signal generators. An additional offset switch is further included coupled to the third signal generator for connecting the third signal generator to the third coarse frequency source in an independent offset mode, or connecting the third signal generator to the first coarse signal generator in a common offset mode.

The multiple signal source/LO module according to the present invention allows a VNA to measure the parameters of a multi-port device in either the independent offset mode or the common offset mode. When the multiple signal source/LO module according to the present invention operates in a common offset mode, that is, when the signal generators are connected to the same coarse frequency source, measurements of scattering parameters can be measured with improved speed and accuracy. In the common offset mode, the multiple signal source/LO module according to the present invention is able to achieve dynamic tracking of the different outputs of the signal generators, to shorten the relative settling time of the (IF) signals, to significantly reduce the relative IF phase noise within the PLL bandwidth, and to avoid the presence of IF spurious signals within the PLL bandwidth.

When the multiple signal source/LO module according to the present invention operates in an independent offset mode, parameters such as harmonic responses, where it is required that large frequency difference exists between the stimulus source outputs and the LO, can be measured reliably with different signal generators using independent coarse frequency sources. Therefore, the multiple signal source/LO module according to the present invention allows different types of parameters to be measured in different modes by simply switching one or more offset switches to connect the signal generators to the desired coarse frequency source.

BRIEF DESCRIPTION OF THE DRAWINGS

The present invention will be described with respect to particular embodiments thereof, and references will be made to the drawings in which.

DETAILED DESCRIPTION

Figure 1:
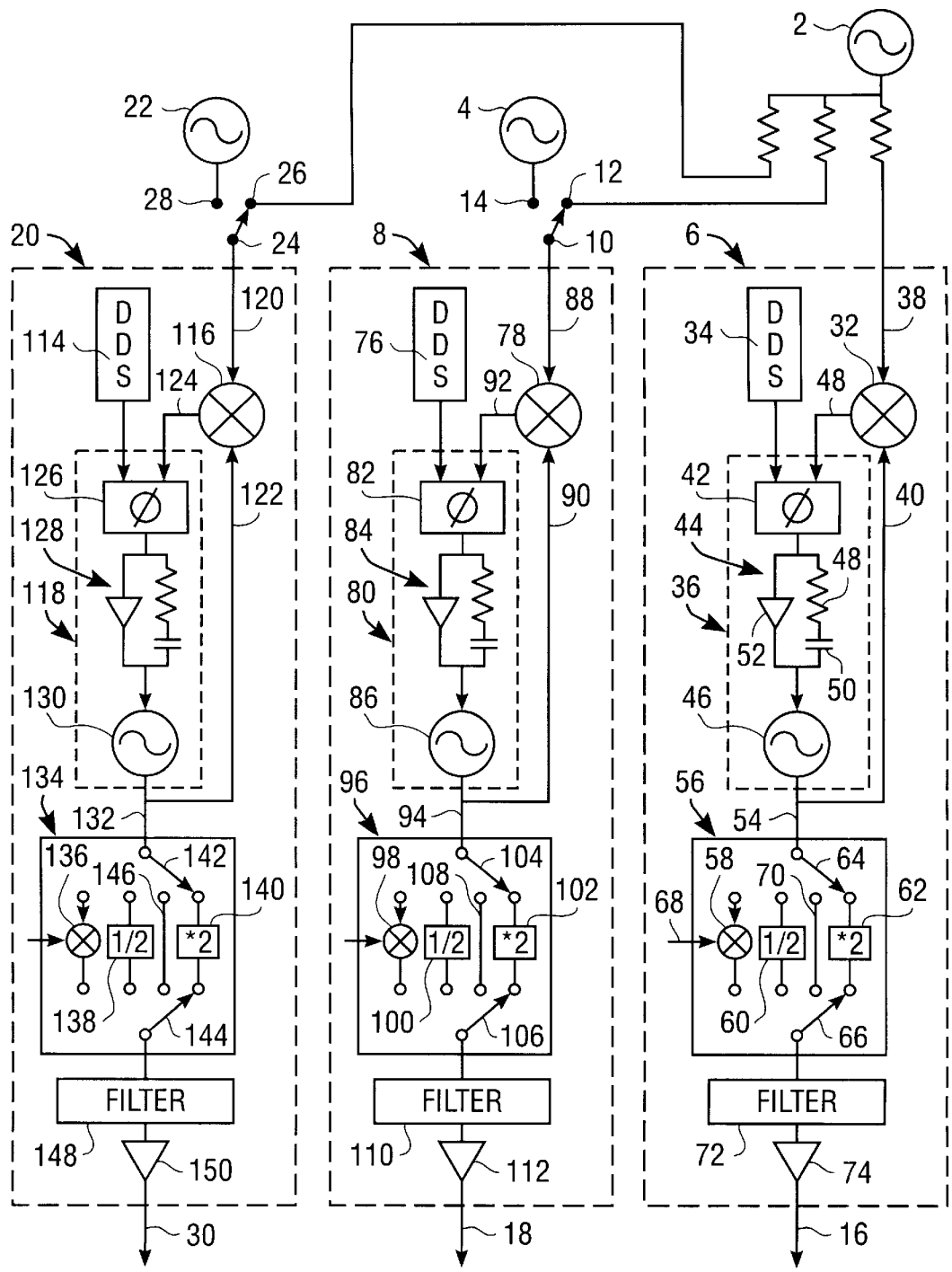
FIG. 1 is a circuit diagram illustrating an embodiment of a dual-mode multiple signal source/local oscillator module according to the present invention.

The present invention provides a dual-mode multiple signal source/local oscillator module with at least two signal outputs at stable frequencies, operative in either an independent offset mode or a common offset mode. As illustrated in FIG. 1, the circuit for the dual-mode multiple signal source/local oscillator module roughly comprises a first coarse frequency source 2, a second coarse frequency source 4, a first signal generator 6 coupled to the first coarse frequency source 2, a second signal generator 8, and an offset switch 10 coupled to the second signal generator 8. The offset switch 10 is capable of connecting the second signal generator 8 either to the first coarse frequency source 2 in a first closed position 12 when the module operates in a common offset mode, or to the second coarse frequency source 4 in a second closed position 14 when the module operates in an independent offset mode.

In an application in which the circuit as shown in FIG. 1 is implemented in a VNA as a multiple source/local oscillator module, the first signal generator 6 may be implemented as a local oscillator having an output 16 which provides a local oscillator (LO) signal. Depending upon the application, the local oscillator signal generated at the output 16 of the first signal generator 6 may provide a signal that mixes against other output signal sources (S1 and S2) to generate the receiver IF. The second signal generator 8 may be implemented in the VNA as a first source signal generator having an output 18 which carries a first stimulus source (S1) signal, that may be presented to the DUT. When the offset switch 10 connects the second signal generator 8 to the first coarse frequency source 2, the first and second signal generators 6 and 8 share a common coarse frequency source 2 and are thus said to be in a common offset mode.

On the other hand, when the offset switch 10 connects the second signal generator 8 to the second coarse frequency source 4, the first source (Si) signal generated at the output 18 of the second signal generator 8 and the local oscillator (LO) signal generated at the output 16 of the first signal generator 6 are independently produced by different coarse frequency sources. The first and second signal generators 6 and 8 are thus said to be in an independent offset mode when the offset switch 10 is in the second closed position 14 to connect the second signal generator 8 to the second coarse frequency source 4.

In a further embodiment, additional signal generators similar to the first and second signal generators 6 and 8 may be provided in the dual-mode multiple signal source/local oscillator module according to the present invention when additional signal sources are desired in some VNA applications. FIG. 1 further illustrates an optional third signal generator 20, a third coarse frequency source 22 and an additional offset switch 24. The additional offset switch 24, which is coupled to the third signal generator 20, is capable of connecting the third signal generator 20 to the first coarse frequency source 2 in the first closed position 26 to set the third signal generator 20 in a common offset mode with respect to the first signal generator 6. Alternatively, the offset switch 24 can be switched to a second closed position 28 to connect the third signal generator 20 to the third coarse frequency source 22 when the third signal generator 20 is desired to be in an independent offset mode with respect to the first signal generator 6.

The third signal generator 20 has an output 30 which carries a second stimulus source (S2) signal that may be presented to the DUT. Depending upon different types of applications, the second and third signal generators 8 and 20 may be both in a common offset mode or both in an independent offset mode with respect to the first signal generator 6. In some other applications, one of the signal generators 8 and 20 may be in an independent offset mode while the other is in a common offset mode with respect to the first signal generator 6. When both the second and third signal generators 8 and 20 are in a common offset mode, all of the signal generators 6, 8 and 20 share a common coarse frequency source 2. Furthermore, the first, second and third signal generators 6, 8 and 20 may have a substantially identical circuit structure in an embodiment.

In a further embodiment, each of the first, second and third signal generators 6, 8 and 20 comprise a fine frequency source, a PLL, a set of optional frequency changers, an output filter and an output amplifier. Referring to FIG. 1, the first signal generator 6 comprises a first mixer 32, a first fine frequency source 34, and a first phase lock circuit 36. The first fine frequency source may comprise a conventional direct digital synthesizer (DDS), for example, with a frequency range of about 1–10 MHz and a frequency resolution of 1 Hz or less. On the other hand, the coarse frequency source may comprise a conventional oscillator, for example, with a frequency range of about 800–1600 MHz and a frequency resolution of 750 KHz.

The first mixer 32 has a first input 38 connected to the first coarse frequency source 2 and a second input 40 connected to the output 54 of the first phase lock circuit 36. In an embodiment, the first phase lock circuit 36 includes a first phase comparator 42, a first loop filter 44 coupled to the first phase comparator 42, and a first voltage controlled oscillator 46 coupled to the first loop filter 44. The first phase comparator 42 has inputs coupled to the first fine frequency source 34 and to the output 48 of the first mixer 32. The phase comparator 42 detects a phase difference between the signals generated by the first fine frequency source 34 and the first mixer 32, and in response generates a pump current indicating whether an upshifting or a downshifting of frequency or phase of the signal at the output 54 is required.

The loop filter 44, which comprises a resistor 48, a capacitor 50 and an amplifier 52 in an embodiment, is an integrator with a desired response to filter out high frequency jitters and noises which may be generated by the phase comparator 42. For example, the loop filter may have a bandwidth of about 30 KHz, with appropriate resistance and capacitance values selected for that bandwidth within the scope of ordinary skill in the art. The loop filter 44 receives the pump current and in response outputs a loop filter voltage to the voltage controlled oscillator 46, which generates a phase locked output signal at a frequency determined by the loop filter voltage. The output 54 of the phase lock circuit 36 is connected to the second input 40 of the first mixer 32 through a feedback path to form a PLL.

In a further embodiment, a first output frequency selector 56 is provided in the first signal generator 6 if the desired frequency generated at the local oscillator (LO) output 16 is different from the frequency generated at the output 54 of the phase lock circuit 36. In yet a further embodiment, the first output frequency selector 56 comprises a set of frequency changers 58, 60 and 62, a first frequency select switch 64, and a second frequency select switch 66. The frequency select switches 64 and 66 each have a plurality of selectably closed positions to connect the output 16 of the first signal generator 6 to the output 54 of the first phase lock circuit 36 through one of the frequency changers selected for increasing or decreasing the frequency of the local oscillator (LO) signal at the output 16.

Examples of the frequency changers as illustrated in FIG. 1 include a mixer 58, a frequency divider 60 and a frequency multiplier 62. If the mixer 58 is implemented to change the frequency of the output local oscillator (LO) signal, an input signal at a stable frequency is provided to one input 68 of the mixer 58, while the frequency select switches 64 and 66 are connected to the mixer 58 to enable the mixer 58 to generate an output signal at a frequency that is the difference between the frequency of the input signal at the input 68 and the frequency produced at the output 54 of the phase lock circuit 36. The mixer 58, the frequency divider 60 and the frequency multiplier 62 shown in FIG. 1 are only some illustrative examples of frequency changers. Other types of frequency change devices known to a person skilled in the art may also be implemented to change the local oscillator output frequency of the first signal generator 6.

In a further embodiment, the first and second frequency select switches 64 and 66 are further capable of forming a direct signal propagating path between the output 54 of the first phase lock circuit 36 and the output 16 of the first signal generator 6 without changing the frequency. A direct signal propagating segment 70 is provided between the frequency select switches 64 and 66, and may comprise a typical coaxial transmission line segment, a waveguide segment, a strip line segment or a microstrip segment, depending upon the frequency range of the PLL output signal.

In a further embodiment, a first output filter 72 is coupled to the output 54 of the first phase lock circuit 36 through the first output frequency selector 56 to provide a clean output with reduced spurious frequency content. In yet a further embodiment, a first amplifier 74 is coupled to the first output filter 72 to generate an amplified local oscillator (LO) signal at the output 16 of the first signal generator 6. In the embodiment shown in FIG. 1, the first output filter 72 is connected to the second frequency select switch 66 in the first output frequency selector 56.

In an alternate embodiment in which the frequency selector 56 is not provided, the first output filter 72 may be connected directly to the output 54 of the phase lock circuit 36. The circuit of the first signal generator 6 as illustrated in FIG. 1 is only one of many possible embodiments for generating a local oscillator (LO) signal. Other circuits can also be designed for generating the local oscillator signal within the scope of the present invention.

FIG. 1 also shows a detailed circuit diagram of an embodiment of the second signal generator 8 which has a substantially identical structure as that of the first signal generator 6. As shown in FIG. 1, the second signal generator 8 includes a second fine frequency source 76, a second mixer 78, and a second phase lock circuit 80. In a further embodiment, the second phase lock circuit 80 includes a second phase comparator 82, a second loop filter 84 coupled to the second phase comparator 82, and a second voltage controlled oscillator 86 coupled to the second loop filter 84. The second mixer 78 has a first input 88 coupled to the offset switch 10, a second input 90 coupled to the output 94 of the second phase lock circuit 80, and an output 92 coupled to the second phase comparator 82.

The phase comparator 82, which has inputs coupled to the second fine frequency source 76 and to the output 92 of the second mixer 78, detects a phase difference between the two input signals and in response generates a pump current to indicate whether an upshifting or a downshifting of the frequency or phase of the output signal is required.

The second loop filter 84 is coupled to receive the pump current from the second phase comparator 82 to filter out undesirable high frequency jitters and noises outside its bandwidth. In an embodiment, the second loop filter 84 is an integrator having the same circuit design as that of the first loop filter 44 in the first signal generator 6. Other types of conventional loop filters known to a person skilled in the art may also be used in the phase lock circuit 80 to generate a desired loop filter voltage. The second voltage controlled oscillator 86, which is coupled to the second loop filter 84, generates a phase locked output signal at a frequency which is determined by the loop filter voltage. The output 94 of the voltage controlled oscillator 86 is coupled to the second input 90 of the second mixer 78 through a feedback path to form a PLL.

In a further embodiment, the output 94 of the phase lock circuit 80 is coupled to a second output frequency selector 96 in the second signal generator 8 if the frequency of the signal (Si) at the output 18 of the second signal generator 8 is desired to be selectively changed. Similar to the first frequency selector 56 in the first signal generator 6, the second output frequency selector 96 in the second signal generator 8 comprises a second set of frequency changers including a mixer 98, a frequency divider 100, and a frequency multiplier 102 in an embodiment. Third and fourth frequency select switches 104 and 106 are provided in the second output frequency selector 96 to enable selective connection of the output 94 of the second phase lock circuit 80 to the output 18 of the second signal generator 8 through any one of the frequency changers. Furthermore, a direct signal propagating segment 108 such as a transmission line segment, a waveguide segment, a strip line segment or a microstrip segment is provided to allow the frequency select switches 104 and 106 to convey the signal generated by the phase lock circuit 80 to the output 18 of the second signal generator 8 without frequency conversion.

In the embodiment shown in FIG. 1, the second signal generator 8 further comprises a second output filter 110 coupled to the frequency select switch 106, and a second output amplifier 112 coupled to the second output filter 110. In an alternate embodiment in which the frequency generated at the output 18 of the second signal generator 8 need not be selectively changed with respect to the frequency generated by the phase lock circuit 80, the second output filter 110 may be connected directly to the output 94 of the second voltage controlled oscillator 86 to filter the signal generated by the phase lock circuit 80.

Referring to FIG. 1, when the offset switch 10 connects the input 88 of the second mixer 78 to the first coarse frequency source 2 in the first closed position 12, the first and second mixers 32 and 78 within the respective first and second signal generators 6 and 8 receive the coarse reference frequency from the same coarse frequency source 2. However, the phase comparators 42 and 82 in the first and second signal generators 6 and 8 receive fine reference frequencies from separate fine frequency sources 34 and 76, respectively. The phase lock circuits 36 and 80 thus produce separate output signals at stable phase-locked frequencies in response to the same coarse frequency adjustments but independent fine frequency adjustments. When the first and second signal generators 6 and 8 share the common coarse frequency source 2, the two signal generators 6 and 8 are in a common offset mode.

On the other hand, when the offset switch 10 connects the input 88 of the second mixer 78 to the second coarse frequency source 4 in the second closed position 14, the first and second signal generators 6 and 8 become mutually independent circuits without sharing the coarse frequency sources. The first and second signal generators 6 and 8 are thus in an independent offset mode.

In an application in which the VNA with the multiple signal source/local oscillator module according to the present invention is used to measure the parameters of a typical single-port or multi-port DUT, the local oscillator (LO) output 16 may be connected to the VNA receiver and the first source (Si) output 18 may be connected as stimulus to the DUT. When the signal generators 6 and 8 in the multiple signal source/local oscillator module according to the present invention are in a common offset mode, the first coarse frequency source 2 with a coarse frequency resolution provides a common input signal to the two signal generators 6 and 8.

Because the phase noises at the outputs 16 and 18 of the first and second signal generators 6 and 8 are contributed to a large degree by the coarse frequency source 2, the phase noises at the outputs 16 and 18 are likely to be correlated with each other in the common offset mode. When the signals are used as inputs to the VNA's receiver, for example, the effect of phase noises at the outputs 16 and 18 of the first and second signal generators 6 and 8 on the IF signal are significantly reduced because of the high degree of correlation between the phase noises. The two signal generators 6 and 8 are thus said to have low relative phase noise because of the phase correlation resulting from using a common coarse frequency source 2 in the common offset mode, and will result in an improvement in the accuracy of the measurement.

Furthermore, the phase lock circuits 36 and 80 in the first and second signal generators 6 and 8 share the common coarse frequency source 2 and receive fine frequency adjustments from the respective fine frequency sources 34 and 76 in the common offset mode. Since only the fine frequency adjustments but not the coarse frequency adjustments are independent for the two signal generators 6 and 8, and since the fine frequency adjustments settle more quickly than the coarse frequency adjustments, the settling times for the output signals of the respective phase lock circuits 36 and 80 to arrive at their stable phase-locked frequencies do not vary greatly from each other. The two signal generators 6 and 8 are thus said to have a short relative settling time and will have improved measurements speeds due to the dynamic tracking.

When the module according to the present invention is in the independent offset mode, the VNA is able to measure parameters in an environment in which the two outputs 16 and 18 differ by a large frequency, i.e. when a high IF is required. Parameters which can be measured in the independent offset mode include harmonic responses, intermodulation products and frequency translation mixer characteristics. When the first and second signal generators 6 and 8 are coupled to separate coarse frequency sources 2 and 4, the coarse frequency sources 2 and 4 may be set to oscillate at two widely separated frequencies. For example, the first coarse frequency source 2 may be used to generate a second harmonic frequency while the second coarse frequency source 4 may be used to generate the fundamental frequency.

The device under test is thereby able to receive an input at the fundamental frequency while the receiver may be tuned to the second harmonic frequency. The independent offset mode thus allows harmonic measurements to be performed on the DUT by the VNA. The multiple source/local oscillator module according to the present invention therefore allows various parameters to be measured with different requirements for the signal outputs.

FIG. 1 further shows a third signal generator 20 in an embodiment in which an additional stimulus source signal (S2) is desired to be generated by the dual-mode multiple signal source/local oscillator module according to the present invention. As shown in FIG. 1, the third signal generator 20 has the same circuit structure as that of the second signal generator 8. A third coarse frequency source 22, which in an embodiment comprises a conventional oscillator, is provided to generate a frequency with a coarse resolution for the third signal generator 20 when the third signal generator 20 is in an independent offset mode with respect to the first signal generator 6.

As shown in FIG. 1, the third signal generator 20 includes a third fine frequency source 114, a third mixer 116, and a third phase lock circuit 118. The third mixer 116 has a first input 120 connected to the offset switch 24, a second input 122 connected to the output 132 of the phase lock circuit 118, and an output 124. The third phase lock circuit 118, which has a circuit structure substantially identical to the first and second phase lock circuits 36 and 80 described above, includes a third phase comparator 126, a third loop filter 128, and a third voltage controlled oscillator 130.

The third phase comparator 126 has inputs coupled to the third fine frequency source 114 and to the output 124 of the third mixer 116, and generates a pump current upon detecting a phase difference between the two input signals to indicate whether an upshifting or downshifting of the frequency produced at the output 132 is required. The third loop filter 128, which comprises a typical integrator in an embodiment, filters out high frequency jitters and noises which may be generated by the phase comparator 126, and outputs a loop filter voltage to the third voltage controlled oscillator 130. The voltage controlled oscillator 130 generates an output signal at a phase locked frequency which is determined by the loop filter voltage generated by the loop filter 128. The output 132 of the voltage controlled oscillator 130 is coupled to the second input 122 of the third mixer 116 through a feedback path to form a PLL.

In a further embodiment, the third signal generator 20 further comprises a third output frequency selector 134 which comprises a plurality of frequency changers including, for example, a mixer 136, a frequency divider 138 and a frequency multiplier 140, as illustrated in FIG. 1. A set of frequency select switches 142 and 144 are provided to couple the output 132 of the phase lock circuit 118 to the output 30 of the third signal generator 20 through any one of the frequency changers. The frequency select switches 142 and 144 each have a plurality of selectively closed positions to connect the output 132 of the third phase lock circuit 118 to the output 30 of the third signal generator 20 through the selected frequency changer. Furthermore, a direct signal propagating segment 146, such as a transmission line segment, a waveguide segment, a strip line segment or a microstrip segment, is provided between the frequency select switches 142 and 144 to allow the output 132 of the third phase lock circuit 118 to be coupled to the output 30 of the third signal generator 20 without frequency conversion.

In yet a further embodiment, a third output filter 148 is coupled to the frequency select switch 144, and a third output amplifier 150 is coupled to the third output filter 148 to generate the additional source signal (S2). In an alternate embodiment in which no frequency conversion is required for the additional source signal (S2) output 30, the third output filter 148 may be coupled directly to the output 132 of the third phase lock circuit 118.

As discussed above, the third signal generator 20 is in a common offset mode with respect to the first signal generator 6 when the third offset switch 24 in position 26 connects the first input 120 of the third mixer 116 to the first coarse frequency source 2. On the other hand, when the offset switch 24 is switched to the second position 28 to connect the first input 120 of the third mixer 116 to the third coarse frequency source 22, the third signal generator 20 operates independently from the first signal generator 6 and is thus in an independent offset mode. The second and third signal generators 8 and 20 may both operate in an independent offset mode or both operate in a common offset mode with respect to the first signal generator 6. Alternatively, one of the signal generators 8 and 20 may operate in an independent offset mode while the other operates in a common offset mode with respect to the first signal generator 6.

Furthermore, the output frequencies generated by the second and third signal generators 8 and 20 may be the same as or different from the local oscillator (LO) frequency generated by the first signal generator 6, by selecting different frequency changers within the respective signal generators. The circuit as illustrated in FIG. 1 thus affords flexibility to the VNA to generate local oscillator and source signals (LO, S1, S2) to satisfy a variety of needs in independent and common offset modes.

Figure 2:
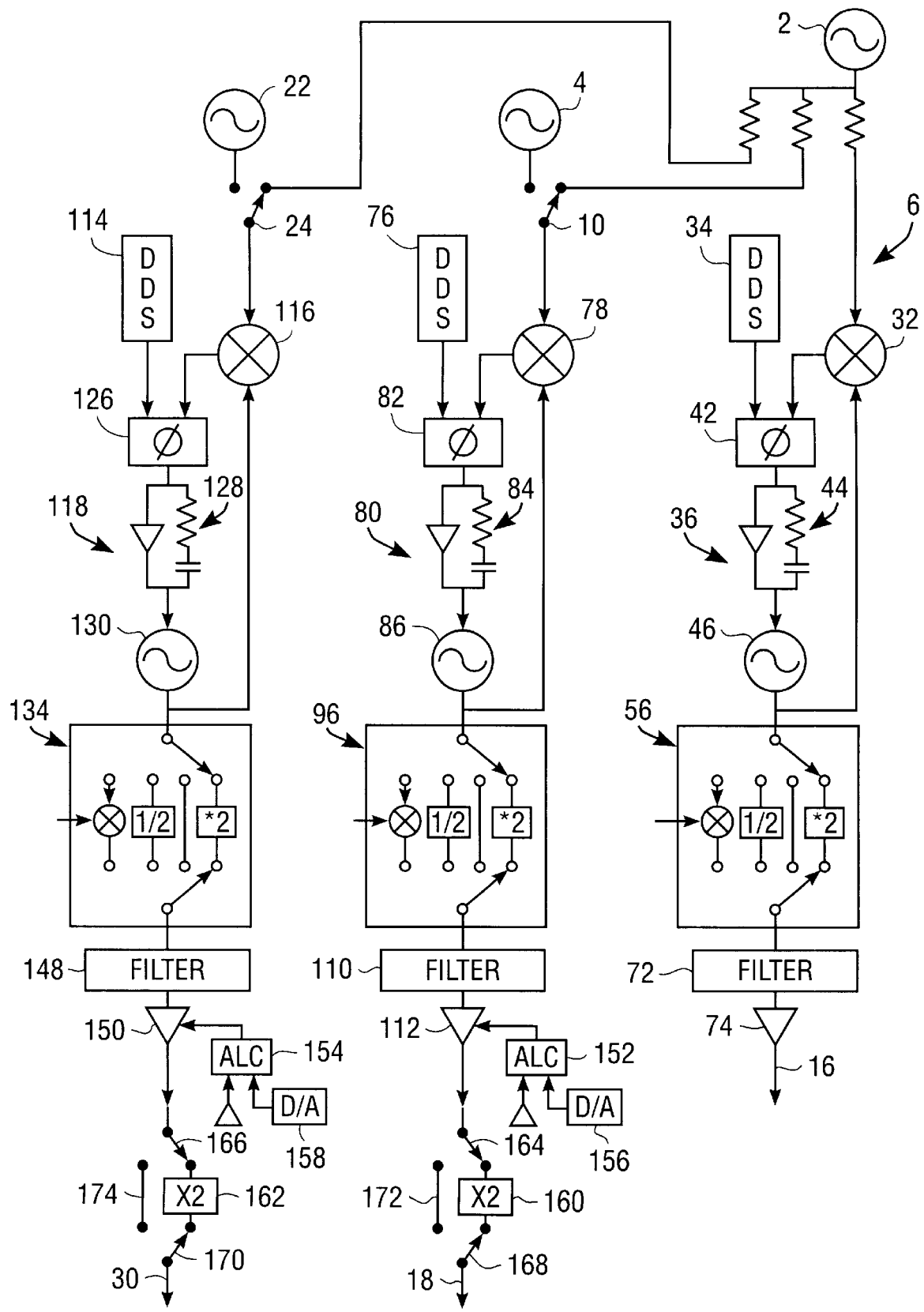
FIG. 2 is a circuit diagram similar to FIG. 1, illustrating a further embodiment including additional output circuit elements in the multiple signal source/local oscillator module according to the present invention.

FIG. 2 shows a circuit diagram similar to FIG. 1, illustrating additional output circuit elements in the second and third signal generators 8 and 20. In this embodiment, the output amplifiers 112 and 150 are controlled by conventional automatic level control (ALC) circuits 152 and 154, respectively, which are known to a person skilled in the art to control the gains of the amplifiers depending upon the desired output power. In a further embodiment, the automatic level control circuits 152 and 154 are controlled by digital-to-analog (D/A) converters 156 and 158, respectively, which receive digital inputs and convert them to analog signals to optimize the gains of the respective amplifiers.

In a further embodiment, the output frequencies generated by the amplifiers 112 and 150 may be selectively coupled to frequency multipliers 160 and 162, respectively, to generate desired output frequencies. Additional sets of frequency select switches 164, 168 and 166, 170 are provided to connect the amplifiers 112 and 150 to the outputs 18 and 30 of the second and third signal generators 8 and 20 through the respective frequency multipliers 160 and 162. Furthermore, direct signal propagating segments 172 and 174 are provided to allow the two sets of frequency select switches 164, 168 and 166, 170 to couple the signals generated by the amplifiers 112 and 150 directly to the outputs 18 and 30, respectively.

The present invention has been described with respect to particular embodiments thereof, and numerous modifications can be made which are within the scope of the invention as set forth in the claims.

What is claimed is:

1. A module comprising:
    a first coarse frequency source;
    a second coarse frequency source;
    a first signal generator coupled to the first coarse frequency source;
    a second signal generator; and
    an offset switch, coupled to the second signal generator, capable of connecting the second signal generator to either the first coarse frequency source in a first closed position, or the second coarse frequency source in a second closed position.

2. The module of claim 1, wherein the first signal generator comprises:
    a first mixer having a first input, a second input and an output, the first input of the first mixer coupled to the first coarse frequency source;
    a first fine frequency source; and
    a first phase lock circuit, having inputs coupled to the first fine frequency source and the output of the first mixer, and an output coupled to the second input of the first mixer.

3. The module of claim 2, wherein the first phase lock circuit comprises:
    a first phase comparator coupled to the first fine frequency source and the output of the first mixer;
    a first loop filter coupled to the first phase comparator; and
    a first voltage controlled oscillator coupled to the first loop filter.

4. The module of claim 2, wherein the first signal generator further comprises a first output filter coupled to the output of the first phase lock circuit.

5. The module of claim 4, wherein the first signal generator further comprises a first amplifier coupled to the first output filter.

6. The module of claim 4, wherein the first signal generator further comprises a first output frequency selector coupled between the output of the first phase lock circuit and the first output filter.

7. The module of claim 6, wherein the first output frequency selector further comprises:
a first set of frequency changers;
a first frequency select switch, coupled to the output of the first phase lock circuit, capable of connecting the output of the first phase lock circuit to a selected one of the frequency changers within the first set; and
a second frequency select switch, coupled to the first output filter, capable of connecting the first output filter to the selected frequency changer within the first set.

8. The module of claim 7, wherein the frequency changers within the first set are selected from the group consisting of frequency multipliers, frequency dividers, and mixers.

9. The module of claim 7, wherein the first and second frequency select switches are further capable of forming a direct signal propagating path between the output of the first phase lock circuit and the first output filter.

10. The module of claim 1, wherein the second signal generator comprises:
a second mixer having a first input, a second input and an output, the first input of the second mixer coupled to the offset switch;
a second fine frequency source; and
a second phase lock circuit, having inputs coupled to the second fine frequency source and the output of the second mixer, and an output coupled to the second input of the second mixer.

11. The module of claim 10, wherein the second phase lock circuit comprises:
a second phase comparator coupled to the second fine frequency source and the output of the second mixer;
a second loop filter coupled to the second phase comparator; and
a second voltage controlled oscillator coupled to the second loop filter.

12. The module of claim 10, wherein the second signal generator further comprises a second output filter coupled to the output of the second phase lock circuit.

13. The module of claim 12, wherein the second signal generator further comprises a second amplifier coupled to the second output filter.

14. The module of claim 12, wherein the second signal generator further comprises a second output frequency selector coupled between the output of the second phase lock circuit and the second output filter.

15. The module of claim 14, wherein the second output frequency selector further comprises:
a second set of frequency changers;
a third frequency select switch, coupled to the output of the second phase lock circuit, capable of connecting the output of the second phase lock circuit to a selected one of the frequency changers within the second set; and
a fourth frequency select switch, coupled to the second output filter, capable of connecting the second output filter to the selected frequency changer within the second set.

16. The module of claim 15, wherein the frequency changers within the second set are selected from the group consisting of frequency multipliers, frequency dividers, and mixers.

17. The module of claim 15, wherein the third and fourth frequency select switches are further capable of forming a direct signal propagating path between the output of the second phase lock circuit and the second output filter.

18. The module of claim 1, wherein the second signal generator is substantially identical to the first signal generator.

19. The module of claim 1, further comprising:
a third coarse frequency source;
a third signal generator; and
an additional offset switch, coupled to the third signal generator, capable of connecting the third signal generator to either the first coarse frequency source in a first closed position, or the third coarse frequency source in a second closed position.

20. The module of claim 19, wherein the third signal generator comprises:
a third mixer having a first input, a second input and an output, the first input of the third mixer coupled to the additional offset switch;
a third fine frequency source; and
a third phase lock circuit, having inputs coupled to the third fine frequency source and the output of the third mixer, and an output coupled to the second input of the third mixer.

21. The module of claim 20, wherein the third phase lock circuit comprises:
a third phase comparator coupled to the third fine frequency source and the output of the third mixer;
a third loop filter coupled to the third phase comparator; and
a third voltage controlled oscillator coupled to the first loop filter.

22. The module of claim 20, wherein the third signal generator further comprises a third output filter coupled to the output of the third phase lock circuit.

23. The module of claim 22, wherein the third signal generator further comprises a third amplifier coupled to the third output filter.

24. The module of claim 22, wherein the third signal generator further comprises a third output frequency selector coupled between the output of the third phase lock circuit and the third output filter.

25. The module of claim 24, wherein the third output frequency selector further comprises:
a third set of frequency changers;
a fifth frequency select switch, coupled to the output of the third phase lock circuit, capable of connecting the output of the third phase lock circuit to a selected one of the frequency changers within the third set; and
a sixth frequency select switch, coupled to the third output filter, capable of connecting the third output filter to the selected frequency changer within the third set.

26. The module of claim 25, wherein the frequency changers within the third set are selected from the group consisting of frequency multipliers, frequency dividers, and mixers.

27. The module of claim 25, wherein the fifth and sixth frequency select switches are further capable of forming a direct signal propagating path between the output of the third phase lock circuit and the third output filter.

28. The module of claim 19, wherein the third signal generator is substantially identical to the first and second signal generators.

29. A module, comprising:
a first coarse frequency source;
a second coarse frequency source;
a first mixer having a first input, a second input and an output, the first input of the first mixer coupled to the first coarse frequency source;
a second mixer having a first input, a second input and an output;
an offset switch, coupled to the second mixer, capable of connecting the first input of the second mixer to either the first coarse frequency source in a first closed position, or the second coarse frequency source in a second closed position;
a first fine frequency source;
a second fine frequency source;
a first phase lock circuit, having inputs coupled to the first fine frequency source and the output of the first mixer, and an output coupled to the second input of the first mixer; and
a second phase lock circuit, having inputs coupled to the second fine frequency source and the output of the second mixer, and an output coupled to the second input of the second mixer.

30. The module of claim 29, wherein the first phase lock circuit comprises:
a first phase comparator coupled to the first fine frequency source and the output of the first mixer;
a first loop filter coupled to the first phase comparator; and
a first voltage controlled oscillator coupled to the first loop filter.

31. The module of claim 29, wherein the second phase lock circuit comprises:
a second phase comparator coupled to the second fine frequency source and the output of the second mixer;
a second loop filter coupled to the second phase comparator; and
a second voltage controlled oscillator coupled to the second loop filter.

32. The module of claim 29, further comprising a first output filter coupled to the output of the first phase lock circuit.

33. The module of claim 32, further comprising a first amplifier coupled to the first output filter.

34. The module of claim 32, further comprising a first output frequency selector coupled between the output of the first phase lock circuit and the first output filter.

35. The module of claim 34, wherein the first output frequency selector further comprises:
a first set of frequency changers;
a first frequency select switch, coupled to the output of the first phase lock circuit, capable of connecting the output of the first phase lock circuit to a selected one of the frequency changers within the first set; and
a second frequency select switch, coupled to the first output filter, capable of connecting the first output filter to the selected frequency changer within the first set.

36. The module of claim 35, wherein the frequency changers within the first set are selected from the group consisting of frequency multipliers, frequency dividers, and mixers.

37. The module of claim 35, wherein the first and second frequency select switches are further capable of forming a direct signal propagating path between the output of the first phase lock circuit and the first output filter.

38. The module of claim 33, further comprising a second output filter coupled to the output of the second phase lock circuit.

39. The module of claim 38, further comprising a second amplifier coupled to the second output filter.

40. The module of claim 38, further comprising a second output frequency selector coupled between the output of the second phase lock circuit and the second output filter.

41. The module of claim 40, wherein the second output frequency selector further comprises:
a second set of frequency changers;
a third frequency select switch, coupled to the output of the second phase lock circuit, capable of connecting the output of the second phase lock circuit to a selected one of the frequency changers within the second set; and
a fourth frequency select switch, coupled to the second output filter, capable of connecting the second output filter to the selected frequency changer within the second set.

42. The module of claim 41, wherein the frequency changers within the second set are selected from the group consisting of frequency multipliers, frequency dividers, and mixers.

43. The module of claim 41, wherein the third and fourth frequency select switches are further capable of forming a direct signal propagating path between the output of the second phase lock circuit and the second output filter.

44. The module of claim 29, further comprising:
a third coarse frequency source;
a third mixer having a first input, a second input and an output;
an additional offset switch, coupled to the third mixer, capable of connecting the first input of the third mixer to either the first coarse frequency source in a first closed position, or the third coarse frequency source in a second closed position;
a third fine frequency source; and
a third phase lock circuit, having inputs coupled to the third fine frequency source and the output of the third mixer, and an output coupled to the second input of the third mixer.

45. The module of claim 44, wherein the third phase lock circuit comprises:
a third phase comparator coupled to the third fine frequency source and the output of the third mixer;
a third loop filter coupled to the third phase comparator; and
a third voltage controlled oscillator coupled to the first loop filter.

46. The module of claim 44, further comprising a third output filter coupled to the output of the third phase lock circuit.

47. The module of claim 46, further comprising a third amplifier coupled to the third output filter.

48. The module of claim 46, further comprising a third output frequency selector coupled between the output of the third phase lock circuit and the third output filter.

49. The module of claim 48, wherein the third output frequency selector further comprises:
a third set of frequency changers;
a fifth frequency select switch, coupled to the output of the third phase lock circuit, capable of connecting the output of the third phase lock circuit to a selected one of the frequency changers within the third set; and a sixth frequency select switch, coupled to the third output filter, capable of connecting the third output filter to the selected frequency changer within the third set.

50. The module of claim 49, wherein the frequency changers within the third set are selected from the group consisting of frequency multipliers, frequency dividers, and mixers.

51. The module of claim 49, wherein the fifth and sixth frequency select switches are further capable of forming a direct signal propagating path between the output of the third phase lock circuit and the third output filter.

52. A dual-mode multiple signal source/LO module for generating at least two output signals in either an independent offset mode or a common offset mode, comprising:
    a first coarse frequency source;
    a second coarse frequency source;
    a first signal generator coupled to the first coarse frequency source;
    a second signal generator; and
    an offset switch, coupled to the second signal generator, capable of connecting the second signal generator to either the first coarse frequency source in the common offset mode, or the second coarse frequency source in the independent offset mode.

53. The module of claim 52, wherein the first signal generator comprises:
    a first mixer having a first input, a second input and an output, the first input of the first mixer coupled to the first coarse frequency source;
    a first fine frequency source; and
    a first phase lock circuit, having inputs coupled to the first fine frequency source and the output of the first mixer, and an output coupled to the second input of the first mixer.

54. The module of claim 53, wherein the first phase lock circuit comprises:
    a first phase comparator coupled to the first fine frequency source and the output of the first mixer;
    a first loop filter coupled to the first phase comparator; and
    a first voltage controlled oscillator coupled to the first loop filter.

55. The module of claim 53, wherein the first signal generator further comprises a first output filter coupled to the output of the first phase lock circuit.

56. The module of claim 55, wherein the first signal generator further comprises a first amplifier coupled to the first output filter.

57. The module of claim 55, wherein the first signal generator further comprises a first output frequency selector coupled between the output of the first phase lock circuit and the first output filter.

58. The module of claim 57, wherein the first output frequency selector further comprises:
    a first set of frequency changers;
    a first frequency select switch, coupled to the output of the first phase lock circuit, capable of connecting the output of the first phase lock circuit to a selected one of the frequency changers within the first set; and
    a second frequency select switch, coupled to the first output filter, capable of connecting the first output filter to the selected frequency changer within the first set.

59. The module of claim 58, wherein the frequency changers within the first set are selected from the group consisting of frequency multipliers, frequency dividers, and mixers.

60. The module of claim 58, wherein the first and second frequency select switches are further capable of forming a direct signal propagating path between the output of the first phase lock circuit and the first output filter.

61. The module of claim 52, wherein the second signal generator comprises:
    a second mixer having a first input, a second input and an output, the first input of the second mixer coupled to the offset switch;
    a second fine frequency source; and
    a second phase lock circuit, having inputs coupled to the second fine frequency source and the output of the second mixer, and an output coupled to the second input of the second mixer.

62. The module of claim 61, wherein the second phase lock circuit comprises:
    a second phase comparator coupled to the second fine frequency source and the output of the second mixer;
    a second loop filter coupled to the second phase comparator; and
    a second voltage controlled oscillator coupled to the second loop filter.

63. The module of claim 61, wherein the second signal generator further comprises a second output filter coupled to the output of the second phase lock circuit.

64. The module of claim 63, wherein the second signal generator further comprises a second amplifier coupled to the second output filter.

65. The module of claim 63, wherein the second signal generator further comprises a second output frequency selector coupled between the output of the second phase lock circuit and the second output filter.

66. The module of claim 65, wherein the second output frequency selector further comprises:
    a second set of frequency changers;
    a third frequency select switch, coupled to the output of the second phase lock circuit, capable of connecting the output of the second phase lock circuit to a selected one of the frequency changers within the second set; and
    a fourth frequency select switch, coupled to the second output filter, capable of connecting the second output filter to the selected frequency changer within the second set.

67. The module of claim 66, wherein the frequency changers within the second set are selected from the group consisting of frequency multipliers, frequency dividers, and mixers.

68. The module of claim 66, wherein the third and fourth frequency select switches are further capable of forming a direct signal propagating path between the output of the second phase lock circuit and the second output filter.

69. The module of claim 52, wherein the second signal generator is substantially identical to the first signal generator.

70. The module of claim 52, further comprising:
    a third coarse frequency source;
    a third signal generator; and
    an additional offset switch, coupled to the third signal generator, capable of connecting the third signal generator to either the first coarse frequency source in the common offset mode, or the third coarse frequency source in the independent offset mode.

71. The module of claim 70, wherein the third signal generator comprises:
    a third mixer having a first input, a second input and an output, the first input of the third mixer coupled to the additional offset switch;

a third fine frequency source; and a third phase lock circuit, having inputs coupled to the third fine frequency source and the output of the third mixer, and an output coupled to the second input of the third mixer.

72. The module of claim 71, wherein the third phase lock circuit comprises:

a third phase comparator coupled to the third fine frequency source and the output of the third mixer;

a third loop filter coupled to the third phase comparator; and a third voltage controlled oscillator coupled to the first loop filter.

73. The module of claim 72, wherein the third signal generator further comprises a third output filter coupled to the output of the third phase lock circuit.

74. The module of claim 73, wherein the third signal generator further comprises a third amplifier coupled to the third output filter.

75. The module of claim 73, wherein the third signal generator further comprises a third output frequency selector coupled between the output of the third phase lock circuit and the third output filter.

76. The module of claim 75, wherein the third output frequency selector further comprises:

a third set of frequency changers;

a fifth frequency select switch, coupled to the output of the third phase lock circuit, capable of connecting the output of the third phase lock circuit to a selected one of the frequency changers within the third set; and a sixth frequency select switch, coupled to the third output filter, capable of connecting the third output filter to the selected frequency changer within the third set.

77. The module of claim 76, wherein the frequency changers within the third set are selected from the group consisting of frequency multipliers, frequency dividers, and mixers.

78. The module of claim 76, wherein the fifth and sixth frequency select switches are further capable of forming a direct signal propagating path between the output of the third phase lock circuit and the third output filter.

79. The module of claim 70, wherein the third signal generator is substantially identical to the first and second signal generators.

* * * * *